United States Patent [19]

Kajikawa

[11] Patent Number: 4,824,805
[45] Date of Patent: Apr. 25, 1989

[54] METHOD OF MANUFACTURING SEMICONDUCTOR DEVICE

[75] Inventor: Yasutomo Kajikawa, Itami, Japan

[73] Assignee: Mitsubishi Denki Kabushiki Kaisha, Tokyo, Japan

[21] Appl. No.: 152,496

[22] Filed: Feb. 5, 1988

[30] Foreign Application Priority Data

Feb. 17, 1987 [JP] Japan ................................. 62-34854

[51] Int. Cl.$^4$ .......................................... H01L 21/265
[52] U.S. Cl. .................... 437/228; 437/229; 437/31; 437/133; 437/105; 437/203; 148/DIG. 11; 357/34; 156/653; 156/657; 156/652
[58] Field of Search ..................... 437/31, 32, 33, 225, 437/228, 133, 105, 233, 231, 203; 148/DIG. 10, DIG. 11, DIG. 72, DIG. 50; 156/652, 653, 656, 657, 659.1; 357/34

[56] References Cited

U.S. PATENT DOCUMENTS

| | | | |
|---|---|---|---|
| 4,038,110 | 7/1977 | Feng | 437/229 |
| 4,545,852 | 8/1985 | Barton | 437/229 |
| 4,634,496 | 1/1987 | Mase | 437/229 |
| 4,675,984 | 6/1987 | Hsu | 437/228 |
| 4,689,113 | 8/1987 | Balasubramanyra | 437/228 |
| 4,746,629 | 5/1988 | Hanagasaki | 437/228 |
| 4,764,483 | 8/1988 | Fuse | 437/229 |
| 4,766,089 | 8/1988 | Davids | 437/229 |

FOREIGN PATENT DOCUMENTS

0276324 12/1986 Japan ................................. 437/229

Primary Examiner—Brian E. Hearn
Assistant Examiner—Kevin McAndrews
Attorney, Agent, or Firm—Oblon, Fisher, Spivak, McClelland & Maier

[57] ABSTRACT

A method of manufacturing a heterojunction bipolar transistor comprising the sequential steps of; forming an extra epitaxial layer (9) on a layered structure which consists of a collector layer (2), a base layer (3), and an emitter layer (4) provided on a semiconductor substrate (1) in that order; forming a recess (10) by selectively etching the extra epitaxial layer (9); and forming an emitter electrode (70a) and a resist mask (70a) in the recess (10) by way of self alignment scheme, where the resist mask (70a) covers the emitter electrode (60e). An extremely small-sized resist mask (70a) can be formed, and extremely small-sized emitter mesa (4a) is formed by applying wet etching to the epitaxial layer (9) and the emitter layer (4) using the resist mask (70a).

8 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device having a semiconductor mesa, and more particularly, it relates to a method of manufacturing a heterojunction bipolar transistor.

2. Description of the Prior Art

A heterojunction bipolar transistor which has specific dimensions of a emitter/base junction being less than that of a collector/base junction, has been widely known in the field of semiconductor devices. The construction and features of the heterojunction bipolar transistor are disclosed in IECEJ Technical Report Vol. 86 No. 227 P. 21, ED86-107 of the Institute of Electronics and Communication Engineers of Japan (IECEJ) for example. Referring to FIG. 1A through FIG. 1H, one of the conventional methods of manufacturing a heterojunction bipolar transistor will be described below.

Figure 1A:
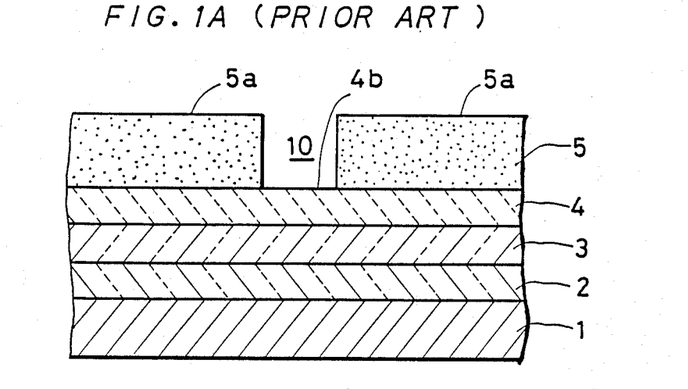
FIG. 1A through FIG. 1H are sectional views of a heterojunction bipolar transistor at main steps of a conventional manufacturing method.
Figure 1B:
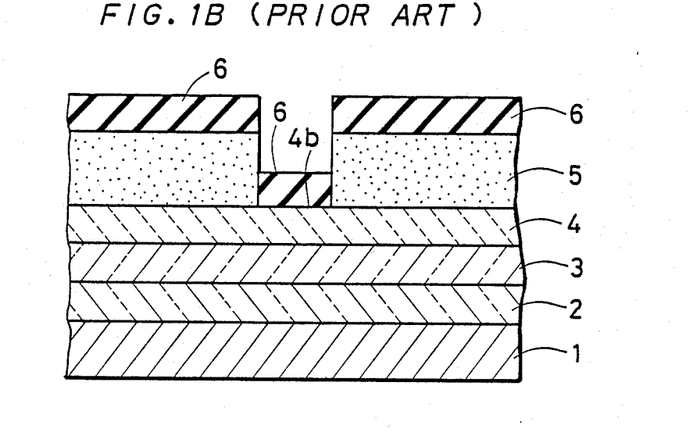
Figure 1C:
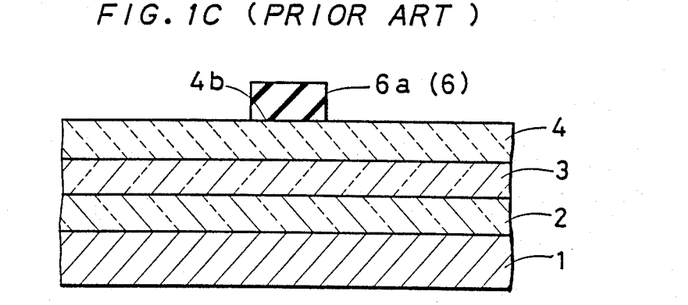

First, as shown in FIG. 1A, a semiconductor substrate 1 is prepared. Then a collector layer 2, a base layer 3, and an emitter layer 4, are sequentially deposited on an upper surface of the semiconductor substrate 1 by applying epitaxial growth technique. Next, a resist 5 is provided on an entire upper surface of the emitter layer 4. The resist 5 is provided withe a window 10 by applying photolithography to the resist 5. Then, as shown in FIG. 1B, a metallic layer 6 is deposited on an upper surface of a remaining portion of the resist 5 and a bare region 4b of the emitter layer 4 by means of vapor deposition. The resist 5 and the metallic layer 6 on the resist 5 are removed by applying lift-off technique (FIG. 1C). The metallic layer 6 formed on the bare region 4b of the emitter layer 4 is served as an emitter electrode 6a.

Figure 1D:
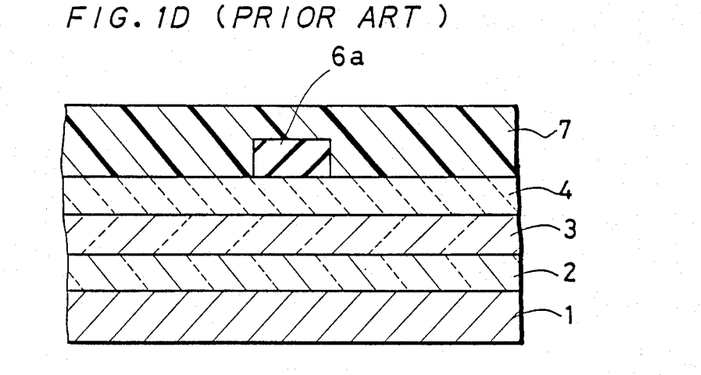
Figure 1E:
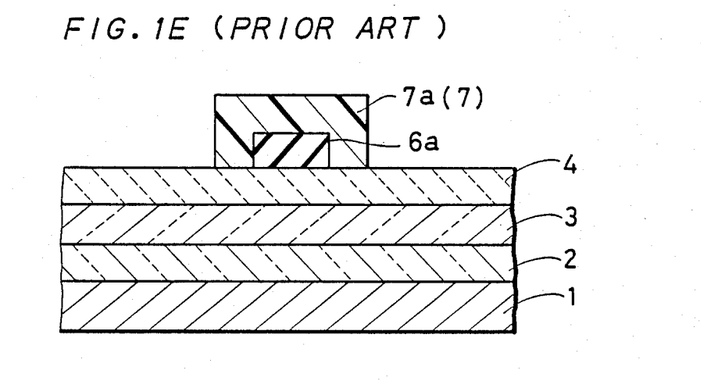
Figure 1F:
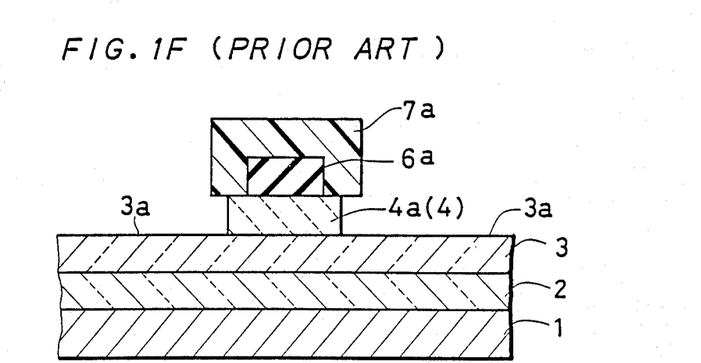

Next, as shown in FIG. 1D, a resist 7 is provided on an upper surface of a bare region of the emitter layer 4 and on the emitter electrode 6a. Then, as shown in FIG. 1E, a part of the resist 7 is selectively removed by means of photolithography to eventually form a resist mask 7a which covers an upper and a side surfaces of the emitter electrode 6a. As shown in FIG. 1F, a part of the emitter layer 4 is selectively removed by wet etching process using the resist mask 7a, thus allowing an emitter mesa 4a to be shaped beneath the resist mask 7a. This process is called "emitter-mesa etching". Side-etch effect of the wet-etching process reduces the dimensions of the emitter mesa 4a to be less than those of the resist mask 7a.

Figure 1G:
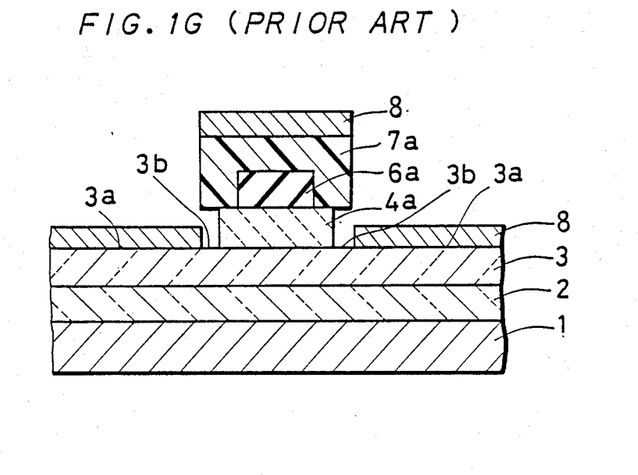
Figure 1H:
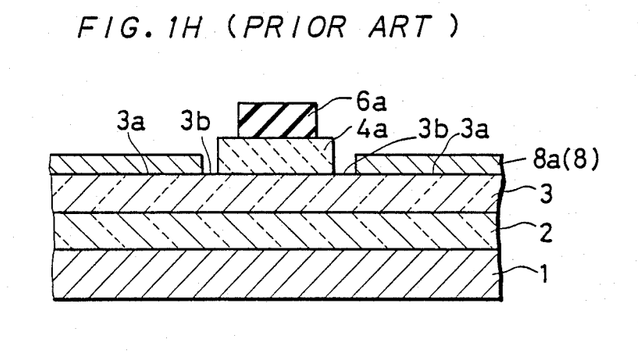

Next, as shown in FIG. 1G, metal is supplied from the upper space by means of vapor deposition so that a metallic layer 8 is formed on an upper surface of the resist mask 7a and also on a plane region 3a, which is substantially a part of an upper surface of the base layer 3 which is not covered by the emitter mesa 4a. Since the resist mask 7a functions as a shielding mask, the metallic layer 8 is not formed on a plane region 3b which is positioned just beneath the resist mask 7a. Next, as shown in FIG. 1H, the resist mask 7a and the metallic layer 8 on the resist mask 7a are respectively removed by means of lift-off technique. The metallic layer 8 remaining on the plane region 3a is eventually utilized for a base electrode 8a.

According to the conventional method of manufacturing a heterojunction bipolar transistor described above, the base electrode 8a is formed by way of self-alignment scheme with respect to the emitter mesa 4a. In other words, as shown in FIG. 1G, the resist mask 7a, which is prepared for shaping the emitter mesa 4a, concurrently functions as a mask for vapor deposition of the base electrode 8a. Consequently, a gap between the emitter mesa 4a and the base electrode 8a, i.e., a width of the plane region 3b, can be made narrow. As a result, an emitter-base resistance is reduced so that a high-frequency characteristics of a heterojunction bipolar transistor is improved.

In order to take full advantage of the potential offered by the heterojunction bipolar transistors, dimensions of the emitter mesa 4a, i.e., emitter-base junction capacitance, are required to be minimized. In the wet etching process for shaping the emitter mesa 4a described at FIG. 1F, a width of the emitter mesa 4a is reduced by a side etching effect. However, since a etching rate in a depthwise direction and that in a lateral direction are almost equal to each other, dimensions of the emitter mesa 4a are limited by the dimensions of the resist mask 7a. Nevertheless, due to certain errors implied in the photolithographic processes done twice during those steps described at FIG. 1A and FIG. 1E, any conventional method cannot actually reduce the dimensions of the resist mask 7a. For example, assuming 2 $\mu$m-rule lithography, then, a width of about 6 $\mu$m is required for the resist mask 7a.

Consequently, since it is quite difficult for any conventional method to reduce the dimensions of the resist mask 7a, any conventional method is obliged to incur substantial difficulty to securely minimize the dimensions of the emitter mesa 4a.

SUMMARY OF THE INVENTION

The present invention is directed to a novel method of manufacturing a semiconductor device having a semiconductor mesa on which a first electrode is formed. According to the present invention, the method comprises the sequential steps of; (a) preparing a semiconductor substrate, (b) forming a semiconductor layer on an upper surface of the semiconductor substrate, (c) shaping a recess in the semiconductor layer, (d) forming a first metallic layer serving as the first electrode on a bottom surface of the recess, (e) forming a resist mask matching a shape of the recess by filling the recess with resist material, (f) selectively removing a part of an upper portion of the semiconductor layer by means of etching using the resist mask, to shape the semiconductor mesa beneath the resist mask, and (g) removing of the resist mask.

According to one of the preferred embodiments of the invention, the semiconductor mesa is surrounded by a plane region which is substantially a lower portion of the semiconductor layer bared by the etching process executed during the step (f), and the method further includes, between steps (f) and (g), a step of; (h) providing metal onto the semiconductor layer, while using the resist mask as a shielding mask to form a second metallic layer as a second electrode on an upper surface of the plane region which is not shielded by the resist mask.

According to an aspect of the invention, the step (c) includes the steps of; (c-1) forming a resist pattern which is provided with a window having a specific width on an upper surface of the semiconductor layer, (c-2) shaping the recess in the semiconductor layer having a specific width greater than the width of the window by means of wet etching process using the formed resist pattern as a shielding mask, and (c-3) removing the resist pattern.

According to another aspect of the invention, the semiconductor mesa is an emitter mesa of a heterojunction bipolar transistor. An extra epitaxial layer is formed on an emitter layer and then, part of the extra epitaxial layer is selectively etched, and as a result, the recess whose bottom surface corresponds to an upper surface of the emitter layer is shaped in the extra epitaxial layer. Finally, an emitter electrode and the resist mask covering the emitter electrode are formed in the recess by way of self-alignment scheme. As a result, in the method of the invention, dimensions of the resist mask are precisely controlled, thus eventually forming such a resist mask ideally suited for making up extremely small-sized emitter mesa.

Accordingly, one of the objects of the present invention is to provide a method of manufacturing a semiconductor device in which dimensions of the semiconductor mesa are minimized.

Another object of the present invention is to provide a method of manufacturing a semiconductor device which attains an extremely small amount of emitter-base junction capacitance in a heterojunction bipolar transistor.

These and other objects, features, aspects and advantages of the present invention will become more apparent from the following detailed description of the invention when taken in conjunction with the accompanying drawings.

DESCRIPTION OF THE PREFERRED EMBODIMENTS

Referring now more particularly to the appended drawings, a preferred embodiment of a method of manufacturing a semiconductor device according to the present invention will be described below. FIG. 2A through FIG. 2J are sectional views of a heterojunction bipolar transistor at main steps of a preferred embodiment of the present invention.

Figure 2A:
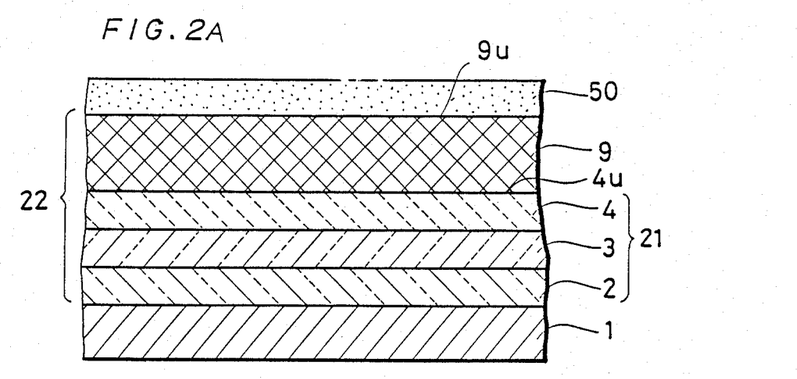
FIG. 2A through FIG. 2J are sectional views of a heterojunction bipolar transistor at main steps of a method according to a preferred embodiment of the present invention.

First, a semiconductor substrate 1 is prepared. Then, as shown in FIG. 2A, on N-type collector layer 2, a P-type base layer 3, and an N-type emitter layer 4 are sequentially and epitaxially grown on an upper surface of the substrate 1 in that order by applying molecular beam epitaxy, for example. A combination consisting of the collector layer 2, the base layer 3, and the emitter layer 4 is called as a first epitaxial layer 21, in the present invention. For example, the semiconductor substrate 1, the collector layer 2 and the base layer 3 are respectively made of GaAs with certain amount of impurities, whereas the emitter layer 4 is made of $Al_xGa_{1-x}As$ with certain amount of impurities, where x denotes a decimal fraction. An extra epitaxial layer 9 (a second epitaxial layer) having a specific thickness is then subjected to growth on an upper surface 4u of the emitter layer 4. A semiconductor multi-layer 22 comprises the epitaxial layers 9 and 21. A layered structure shown in FIG. 2A is finally obtained by coating a resist 50 entirely over an upper surface 9u of the epitaxial layer 9.

Figure 2B:
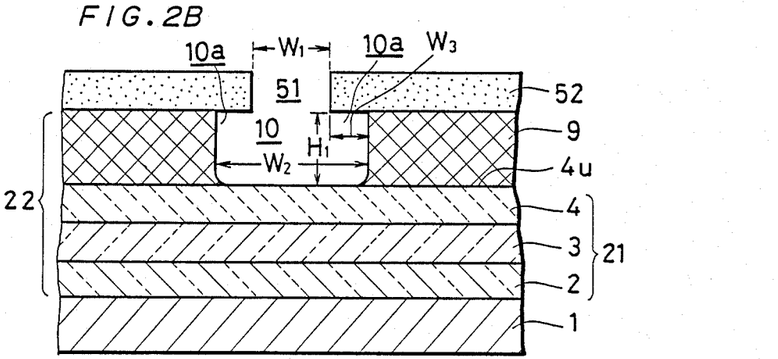

Next, referring now to FIG. 2B, a window 51 having a specific width $W_1$ is formed in the resist 50 by applying photolithography to allow a resist pattern 52 to be shaped. Then, the second epitaxial layer 9 is etched by applying wet-etching with the resist pattern 52 which functions as a shielding mask. By the wet-etching, a recess 10 shown in FIG. 2B is formed in the second epitaxial layer 9 so that the recess 10 reaches an upper surface 4u of the emitter layer 4. As is generally known, since the wet-etching process implies a side-etch effect, an undercut portion 10a is formed in the second epitaxial layer 9 during the forming process of the recess 10. Consequently, the recess 10 has a specific width $W_2$ which is greater than the width $W_1$ of the window 51. A ratio of an etching speed in the direction of the depth to an etching speed in the lateral direction during the wet-etching process is dependent on a type of etching and so on, and thus, the etching speeds in both directions are preliminarily known. Accordingly, a width $W_3$ of the undercut portion 10a can be determined at a desired value by appropriately selecting the width $W_1$ of the window 51 and a thickness $H_1$ of the second epitaxial layer 9, which corresponds to a depth of the recess 10.

Figure 2C:
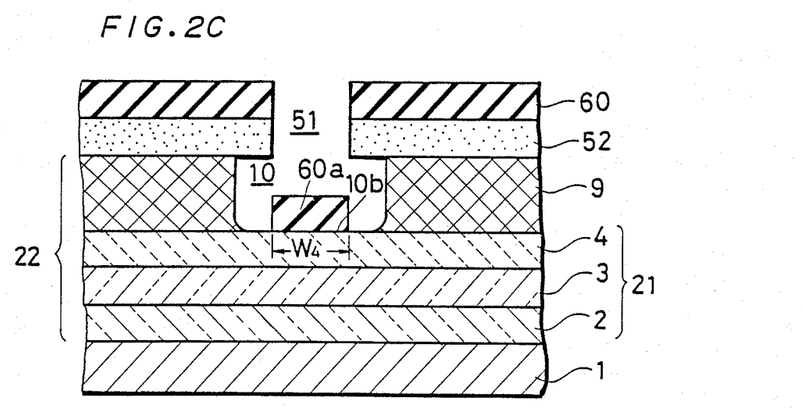
Figure 2D:
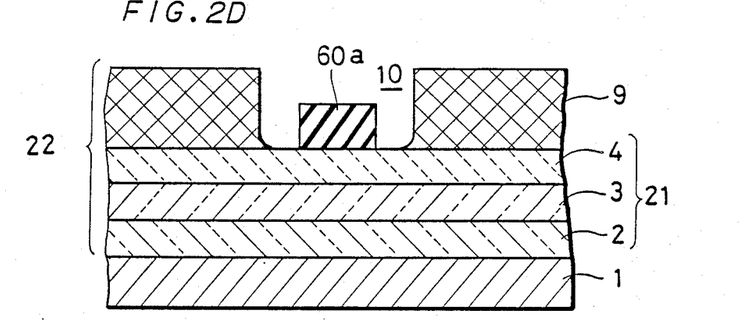

Referring now to FIG. 2C, after obtaining the structure shown in FIG. 2B, metal is deposited onto a bottom surface 10b of the recess 10 from over the resist pattern 52 by means of vapor deposition. The vapor deposition process allows a metallic layer 60a to be formed on the bottom surface 10b of the recess 10, in which the bottom surface 10b corresponds to a part of the upper surface 4u of the emitter layer 4. The metallic layer 60a is utilized for an emitter electrode, whose width $W_4$ is almost equal to the width $W_1$ of the window 51. as a result of the vapor deposition process, a metallic layer 60 is formed even on an upper surface of the resist pattern 52. However, as shown in FIG. 2D, the metallic layer 60 is removed together with the resist pattern 52 by applying lift-off technique.

Figure 2E:
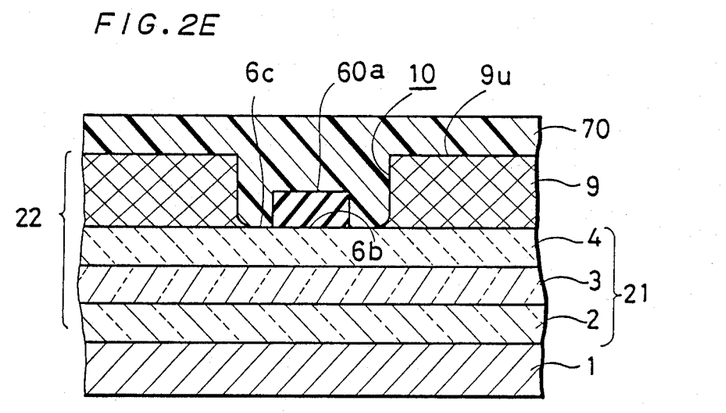

Next, as shown in FIG. 2E, a resist 70 is coated in order to completely fill the recess 10 and cover the second epitaxial layer 9. The resist 70 covers an upper surface 6c of the emitter layer 4 except for a surface 6b which remains in contact with the emitter electrode 60a.

Figure 2F:
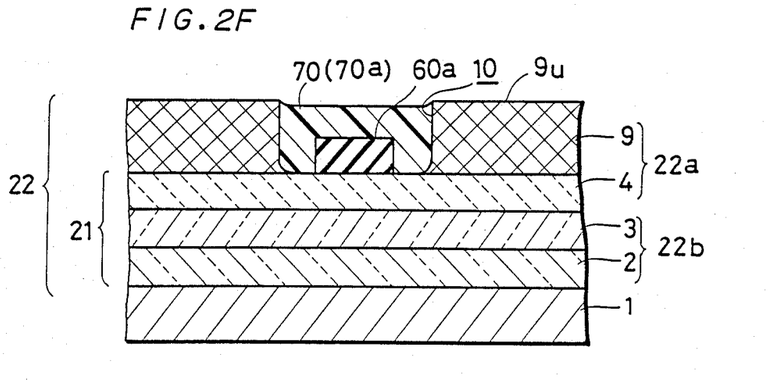

As shown in FIG. 2F, the resist 70 is removed by dry-etching process until the upper surface 9u of the second epitaxial layer 9 becomes bare. However, the resist 70 filled inside of the recess 10 remains unremoved. The resist 70 filled inside of the recess 10 is effectively used for a resist mask 70a, which is needed for shaping an emitter mesa 4a as described later on.

The second epitaxial layer 9 and a part of the emitter layer 4 are respectively removed by wet-etching process with the resist mask 70a, thus eventually shaping the emitter mesa 4a (FIG. 2G) beneath the resist mask 70a. In other words, an upper layer 22a of the semiconductor multi-layer 22 shown in FIG. 2F is selectively removed by this wet-etching process. The emitter mesa 4a is surrounded by a plane region 23 which makes up a part of a lower layer 22b of the semiconductor multi-layer 22. The side-etching effect (i.e., an undercut effect) causes a width $W_5$ of the emitter mesa 4a to become smaller than a width $W_2$ of the resist mask 70a, where the width $W_2$ of the resist mask 70a is almost equal to the width $W_2$ of the recess 10. A width $W_6$ of an undercut portion can be controlled by determining a thickness of the emitter layer 4 in consideration of a ratio of a etching speed in the depthwise direction to that in the lateral direction. This in turn allows the width $W_5$ of the emitter mesa 4a to be properly adjusted to have a desired value. As a result, when the width $W_4$ of the emitter electrode 60a is almost 2 $\mu$m, then, the width $W_5$ of the emitter mesa 4a can be made to be slightly greater than 2 $\mu$m. As is clear from the process described above, the emitter electrode 60a is properly positioned on the mesa 4a, since they are formed by utilizing the recess 10 as a common positional reference. Furthermore, the emitter mesa 4a is formed by way of self-alignment scheme with respect to the emitter electrode 6a. Therefore, the dimensions of the emitter mesa 4a can be extremely reduced.

Figure 2G:
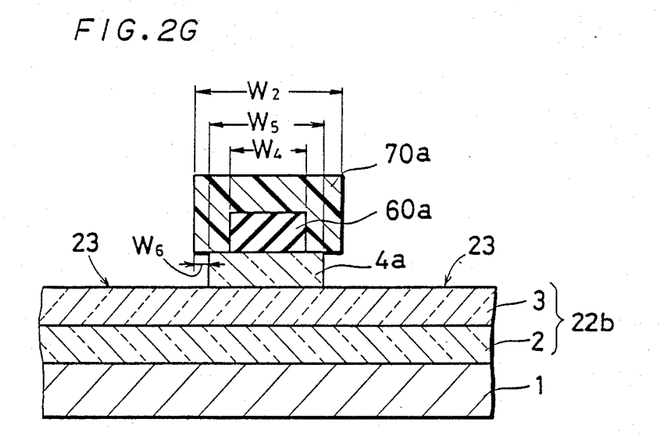
Figure 2H:
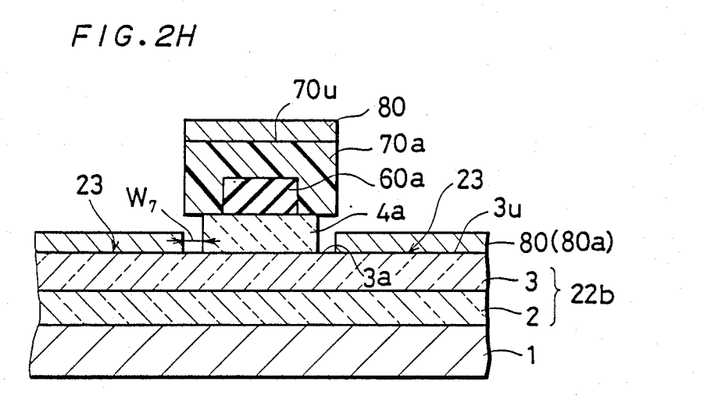

Next, metal vapor deposition is executed over an upper surface 3u of the base layer 3 and an upper surface 70u of the resist mask 70a from the upper space, and thus, as shown in FIG. 2H, a metallic layer 80 is provided on those surfaces 3u and 70u. However, the metallic layer 80 is not provided on the plane region 3a which is a part of the upper surface 3u of the base layer 3 and is in the position close to the emitter mesa 4a. This is because the region 3a, which is also a part of a plane region 23, is in the position under the resist mask 70a, and as a result, evaporated metal is shut off out of the plane region 3a by the resist mask 70a. The metallic layer 80 formed on the upper surface 3u of the base layer 3 is utilized for a base electrode 80a. A width $W_7$ of the plane region 3a is almost equal to the width $W_6$ of the undercut portion. Since the base electrode 80a is formed by way of self-alignment scheme with respect to the emitter mesa 4a, the width $W_7$ shown in FIG. 2H can adequately be reduced. Next, the metallic layer 80, the upper surface 70u and the resist mask 70a are removed by means of lift-up technique, thus a state shown in FIG. 2I is obtained.

Figure 2I:
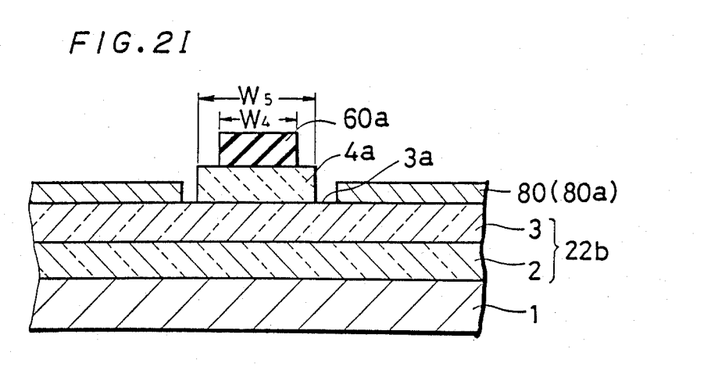
Figure 2J:
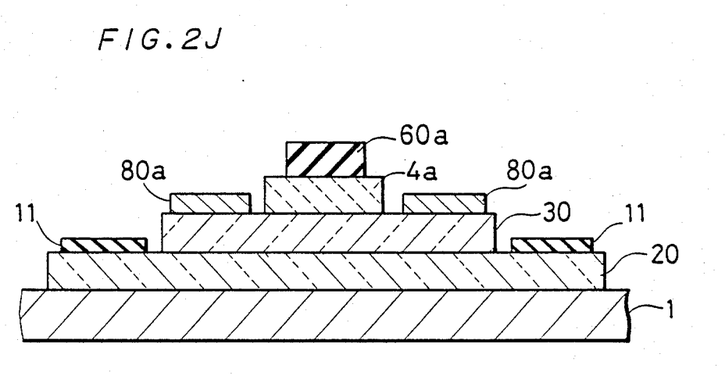

Finally, a semiconductor device shown in FIG. 2J is obtained by shaping up a base mesa 30, a collector electrode 11, and a collector mesa 20 by means of photolithography, lift-off technique, metal vapor deposition, and so on.

It should be noted that those processes from FIG. 2I to FIG. 2J are know in a prior art disclosed in the IECEJ Technical Report Vol. 86 No. 227 P. 21, ED8-6-107 of the Institute of Electronics and Communication Engineers of Japan (IECEJ), published in November 1986, for example. FIG. 2j represents a state in which a part of both the base electrode 80a and the base layer 3 is removed by an etching process. And the collector electrode 11 is formed on a bared upper surface of the collector layer 20.

According to the preferred embodiment of the present invention described above, formation of an emitter electrode and etching process of an emitter layer (i.e., a first epitaxial layer) can respectively be executed by way of self-alignment scheme using a recess formed by the etching of a second epitaxial layer, and as a result, the preferred embodiment described above securely provides an ideal heterojunction bipolar transistor having an emitter mesa which is extremely small in dimensions. Likewise, since a base electrode is also formed by way of self-alignment scheme with respect to the emitter mesa, a gap between the emitter mesa and the base electrode is made to be extremely narrow. Furthermore, since the emitter electrode is properly shielded by a resist, abnormal etching can be prevented when the emitter layer is subjected to the etching process.

It should be understood that respective one of the collector layer 2, base layer 3, and the emitter layer 4 are formed by a single epitaxial layer in the embodiment, however, each of these layers may also be comprised of a plurality of epitaxial layers as well. Actually, the preferred embodiment of the method of manufacturing a semiconductor device related to the present invention is effectively applicable to the production of a variety of devices having a semiconductor mesa.

Furthermore, after completing the process shown in FIG. 2G, external base regions with low resistance characteristic may be provided in both the collector layer 2 and the base layer 3 by selectively injecting ionized P-type impurities into the base layer 3 and the collector layer 2 from both sides of the resist 70a which serves as a shielding mask.

Figure 3:
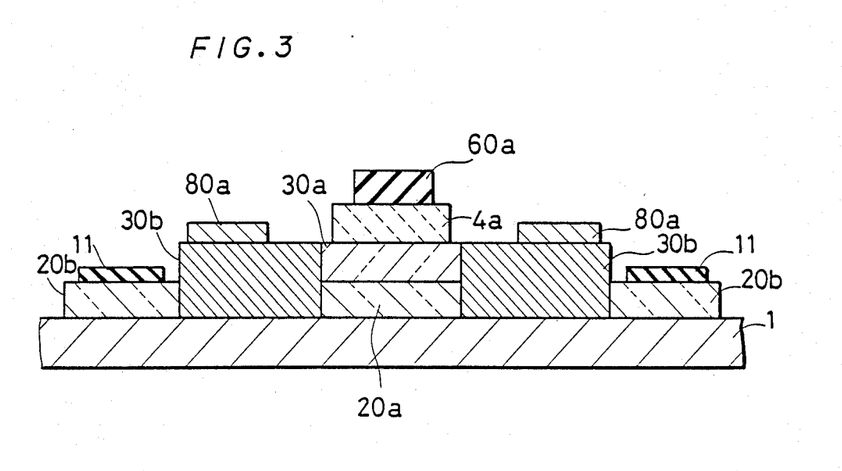
FIG. 3 is a sectional view of a heterojunction bipolar transistor produced by a modification of the embodiment of the present invention.

FIG. 3 represents an example of a semiconductor device, i.e., a heterojunction bipolar transistor, which is manufactured by another preferred embodiment of the present invention just mentioned above. A residual base layer 30a and a residual collector layer 20a are respectively present under the emitter mesa 4a. The base electrodes 80a are formed on an upper surface of an external base region 30b provided by the process described above. A pair of collector mesa 20b are respectively formed a the positions adjoining the external base regions 30b. The collector electrodes 11 are respectively formed on the upper surfaces of these collector mesas 20a. These base electrodes 80a may be positioned on both sides apart from the emitter electrode 60a. This is because base-emitter resistance is adequately reduced since the external base regions 30a featuring low resistance characteristic are respectively formed by way of self-alignment scheme with respect to the emitter electrode 60a.

The present invention has thus far described in reference to the accompanying drawings. However, it should be understood that the description and the drawings are merely presented by way of illustration and example, and thus by no means limitative. The spirit and scope of the invention are defined only by the terms of the following claims.

What is claimed is:

1. A method of manufacturing a semiconductor device having a semiconductor mesa on which a first electrode is formed, said method comprising the sequential steps of;
   (a) preparing a semiconductor substrate;
   (b) forming a semiconductor layer on an upper surface of said semiconductor substrate;
   (c) shaping a recess in said semiconductor layer;
   (d) forming a first metallic layer serving as said first electrode on a bottom surface of said recess;
   (e) forming a resist mask matching a shape of said recess by filling said recess with resist material;
   (f) selectively removing an upper portion of said semiconductor layer by etching process using said resist mask to shape said semiconductor mesa beneath said resist mask; and
   (g) removing said resist mask.

2. A method of manufacturing a semiconductor device defined in claim 1, wherein
   said semiconductor mesa is surrounded by a plane region which is substantially a lower portion of said semiconductor layer bared by said etching process executed during said step (f), and said method further includes, between said steps (f) and (g), a step of (h) providing metal onto said semiconductor layers while using said resist mask as a shielding mask to form a second metallic layer as a second electrode eon a portion of an upper surface of said plane region which is not shielded by said resist mask.

3. A method of manufacturing a semiconductor device defined in claim 2, wherein said etching process executed during said step (f) is done until a width of said semiconductor mesa becomes smaller than a width of said resist mask so that a part of said plane region close to said semiconductor mesa, is present beneath said resist mask, and said second metallic layer is not formed on said part of said plane region.

4. A method of manufacturing a semiconductor device defined in claim 3, wherein said step (c) further includes the steps of;

(c-1) forming a resist pattern which is provided with a window having a specific width on an upper surface of said semiconductor layer;

(c-2) forming said recess in said semiconductor layer by applying wet-etching process employing said resist pattern as a mask, where a width of said recess is greater than said with of said window; and (c-3) removing said resist pattern.

5. A method of manufacturing a semiconductor device defined in claim 4, wherein said step (d) further includes a step of:

(d-1) depositting metal on said bottom surface of said recess through said window of said resist pattern by means of vapor deposition; and a width of said first metallic layer is substantially identical to said width of said window and smaller than said width of said recess.

6. A method of manufacturing a semiconductor device defined in claim 5, wherein said semiconductor layer is a semiconductor multilayer comprising;

a first semiconductor layer provided on said upper surface of said semiconductor substrate; and a second semiconductor layer provided on a upper surface of said first semiconductor layer; wherein said bottom surface of said recess is a part of said upper surface of said first semiconductor layer; and whole of said second semiconductor layer and a part of said first semiconductor layer are removed by said etching process executed by said step (f).

7. A method of manufacturing a semiconductor device defined in claim 6, wherein said semiconductor mesa is an emitter mesa of a heterojunction bipolar transistor;

said first semiconductor layer consists of a collector layer, a base layer, and an emitter layer, which are sequentially provided on said upper surface of said semiconductor substrate in that order; and a part of said emitter layer is selectively removed by said etching process executed in said step (f).

8. A method of manufacturing a semiconductor device defined in claim 7, wherein said first and second metallic layers are respectively formed by metal vapor deposition.

* * * * *